United States Patent [19]
Huggins

[11] Patent Number: 5,956,478
[45] Date of Patent: *Sep. 21, 1999

[54] METHOD FOR GENERATING RANDOM TEST CASES WITHOUT CAUSING INFINITE LOOPS

[75] Inventor: James Dwain Huggins, Hudson, Mass.

[73] Assignee: Digital Equipment Corporation, Maynard, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/526,856

[22] Filed: Sep. 11, 1995

Related U.S. Application Data

[63] Continuation of application No. 08/526,856, Sep. 11, 1995.
[51] Int. Cl.$^6$ .................................................. G06F 11/263
[52] U.S. Cl. ............................... 395/183.09; 395/183.11; 395/581; 395/588; 371/27.1
[58] Field of Search .......................... 395/183.09, 183.08, 395/183.01, 183.11, 571, 581, 580, 588; 364/579; 371/27.1, 27.2

[56] References Cited

U.S. PATENT DOCUMENTS

| | | |
|---|---|---|
| 4,819,233 | 4/1989 | Delucia et al. ..................... 395/183.14 |
| 5,202,889 | 4/1993 | Aharon et al. ............................. 371/27 |
| 5,345,450 | 9/1994 | Saw et al. .................................. 371/27 |
| 5,428,786 | 6/1995 | Sites ........................................ 395/700 |
| 5,488,573 | 1/1996 | Brown et al. ........................... 364/578 |
| 5,507,030 | 4/1996 | Sites ........................................ 395/800 |
| 5,542,043 | 7/1996 | Cohen et al. ....................... 395/183.08 |
| 5,572,666 | 11/1996 | Whitman ............................ 395/183.08 |
| 5,577,198 | 11/1996 | Willrett et al. ..................... 395/183.09 |

*Primary Examiner*—Robert W. Beausoliel, Jr.
*Assistant Examiner*—Scott T. Baderman
*Attorney, Agent, or Firm*—Christopher J. Cianciolo

[57] ABSTRACT

A method for generating test cases for testing integrated circuits which comprises the step of apportioning a plurality of instructions into a plurality of groups of test instructions. At least some of the plurality of groups include a plurality of control flow instructions each of which transfer execution to a different one of the plurality of groups. This method prevents a test of an integrated circuit from entering an infinite loop.

8 Claims, 4 Drawing Sheets

METHOD FOR GENERATING RANDOM TEST CASES WITHOUT CAUSING INFINITE LOOPS

This application is a continuation of application Ser. No. 08/526,856, filed Sep. 11, 1995.

BACKGROUND OF THE INVENTION

This invention relates generally to computer systems and more specifically to a method for testing integrated circuits.

As it is known in the art, a computer system is generally comprised of a central processing unit, a memory system, a cache system, an IO system, and a system bus for connecting each. The central processing unit is generally comprised of a program counter, a memory management unit for reading and writing memory, control logic for fetching instructions from memory, and an execution box for executing instructions which includes an arithmetic logic unit and high speed memory locations referred to as registers.

When system engineers design a computer system, they perform functional and timing parameter calculations to ensure that all elements of the system will operate correctly by meeting the requirements of each element which it interfaces with. For example, if a central processing unit is going to interface with an attached memory system it has to have a sufficient number of address lines for accessing all parts of the memory. Further, the address lines have to be connected to the appropriate places in the memory system and the timing, which governs when the address is presented to the associated memory has to agree with the input-output timing of the memory system.

In a computer system, a central processing unit's foremost job is to fetch an instruction from memory and to execute the specified operation. Computer programs are groups of these instructions constructed in a sequenced order to guide the computer system in performing a task. A central processing unit executing a program fetches an instruction from memory, stores the location of the next instruction in the sequence, manipulates the data as instructed, stores the result, and fetches the next instruction.

The basic types of CPU instructions are generally comprised of control flow instructions, data read instructions, data write instructions, data compare instructions, logical operation instructions, and null instructions. The control flow instructions are comprised of conditional and unconditional branching operations which cause program execution to jump to different sequences of instructions based on the occurrence of a specified system event or a data value. These are important instructions because they guide the CPU in executing the correct sequence of read, write, and compare instructions to properly accomplish the desired task.

In order to verify that the timing and functionality of each element in a computer system will work properly, system engineers produce a computer model of the design. Each element in the system has a unique model which represents the operation of its input and output signals in response to stimulus from other elements which interface with it. Generally the models representing the central processing unit are the most complex. These CPU models have to be sophisticated enough to fetch, and respond properly to, programs of instructions stored in simulated memory elements.

In order to sufficiently test these circuits the simulation programs have to exercise the model as extensively as possible. In order to do this, a method of simulating integrated circuits with randomly generated test cases is employed. This type of testing presents simulated inputs to a model of an integrated circuit and monitors the resulting state of the device. In this manner a design engineer can verify that an integrated circuit meets its functional requirements before receiving actual hardware. The testing process can be as complex as functionally providing the device with simulated memory, clocks, and registers necessary for proper operation and then testing the device by providing a simulated stream of machine code instructions. A test would include monitoring all system attributes such as address, data, interrupts, cache operations, the value of registers and flags, and bus contention. This scenario usually involves the simulation of complex CPU circuitry.

One technique known in the art was to manually design a set of test cases by hand to control the functional simulation of the chip's circuits. Each pass of instructions would attempt to test a specific function of the design's operation and were designed to bring about marginal functional and timing conditions which could cause a device to fail.

One problem with this technique is that manual generation of test cases is a tedious process made even more difficult by the ever growing complexity of circuits to be tested. One of the main problems was that test case generation was time consuming. For each mode of operation an engineer had to generate many test cases which he or she believed would bring about a marginal functional or timing condition. This process was inefficient because the coverage of the tests depended entirely on the number of test cases that the engineer could foresee. Many problem areas could be overlooked because the engineer could not conceive of the results of a complex test case or the interaction between different test cases. A further problem is that each engineer has his or her own style of writing test cases which could lead to oversight of certain failing conditions.

Because of these many problems, automated test case generating methods were developed. A design engineer would input the "rules" of the test, for example the instructions for a central processing unit, and then these systems randomly generated groups of test cases. These systems offered the benefits of reduced generation time and produced tests which exercised the device in a manner which was closer to actual operation. The engineer could still tailor any specific test, but the test generator could use that test in random combination with other tests to increasing its effectiveness.

A benefit of these systems was the generation of random branching and jumping tests through the use of control flow instructions. Control flow instructions allow programs to jump to different sections of code depending on the happening of specified conditions. Today this has the advantage of testing the jump or branch prediction algorithms that are built into many CPUs. These algorithms attempt to predict whether a jump or branch instruction will execute before actually evaluating the condition that will cause the jump or branch to happen. The CPU will begin acting on this prediction, for example gaining access to a particular location in memory, in order to speed up the overall transaction. Because these algorithms are so crucial to the speed of a computer system it is vital that they are highly stressed during simulation.

Random generation of test cases however, leads to the problem of developing infinite looping tests. An infinite loop is constructed where the test code jumps to an instruction block whose operation causes a jump back to the block that originally jumped to it. Once in this loop the test program will remain until it is stopped by the engineer or until the system runs out of memory. The problem with this is that it prevents the execution of any test instruction that comes afterwards and yields no further useful information.

Prior art systems attempted to get around the problem of infinite loops by allowing test case generators to branch only in the forward direction. This means that a program counter is continually incremented until the end of the program is reached. This method prevents infinite loops in the test process however it also excludes cases comprised of complex jumping and branching operations which might be encountered during actual operation of the hardware. Moreover the use of backward branching, which is highly beneficial to the test process since it allows controlled loops to be implemented, is also restricted. Controlled loops are produced by allowing the program counter to be reset to the instruction at the beginning of the loop. They are used to cause overflow conditions in buffers, to cause assertion of interrupts, to test special looping instructions available in most CPU designs, to wait for certain conditions to occur, and many other useful testing functions. This solution therefore severely limits the effectiveness of randomly generated simulation test cases.

SUMMARY OF THE INVENTION

In accordance with the present invention, a method for generating test cases for testing integrated circuits includes the step of apportioning a plurality of instructions into a plurality of groups of test instructions, referred to as blocks, with at least some of the blocks including a plurality of control flow instructions. Each block can have only one branch path to it, therefore each control flow instruction is allowed to transfer execution to a different one of the plurality of blocks. With such an arrangement, the generation of infinitely looping test cases is avoided because there can be only one branch path to each group of instructions. This prevents a branching instruction in a first group of instructions from jumping to a second group of instructions whose operation is to jump back to the first group which would cause an infinite testing loop to occur.

BRIEF DESCRIPTION OF THE DRAWINGS

The foregoing features of this invention, as well as the invention itself, may be more fully understood from the following detailed description when read in conjunction with the accompanying drawings, in which.

DESCRIPTION OF THE PREFERRED EMBODIMENT

Figure 1:
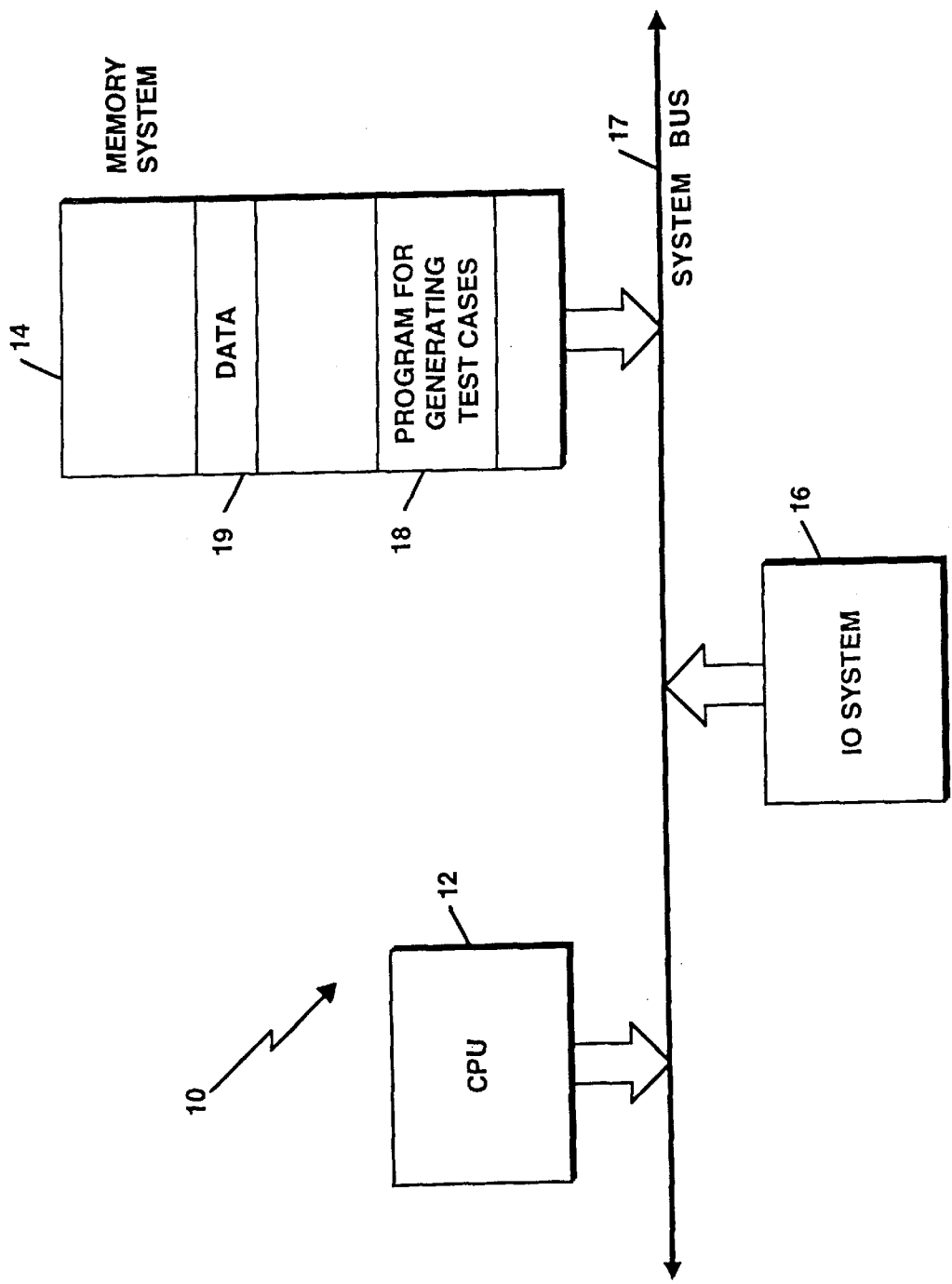
FIG. 1 is a block diagram of a computer system.

Referring now to FIG. 1, a computer system 10 is shown to include a central processing unit 12, a memory system 14, and an IO system 16, interconnected by a system bus 17. The memory system 14 stores a program 18 for generating complex branching test cases without infinite loops, as well as data 19 necessary for operation of the program.

Figure 2:
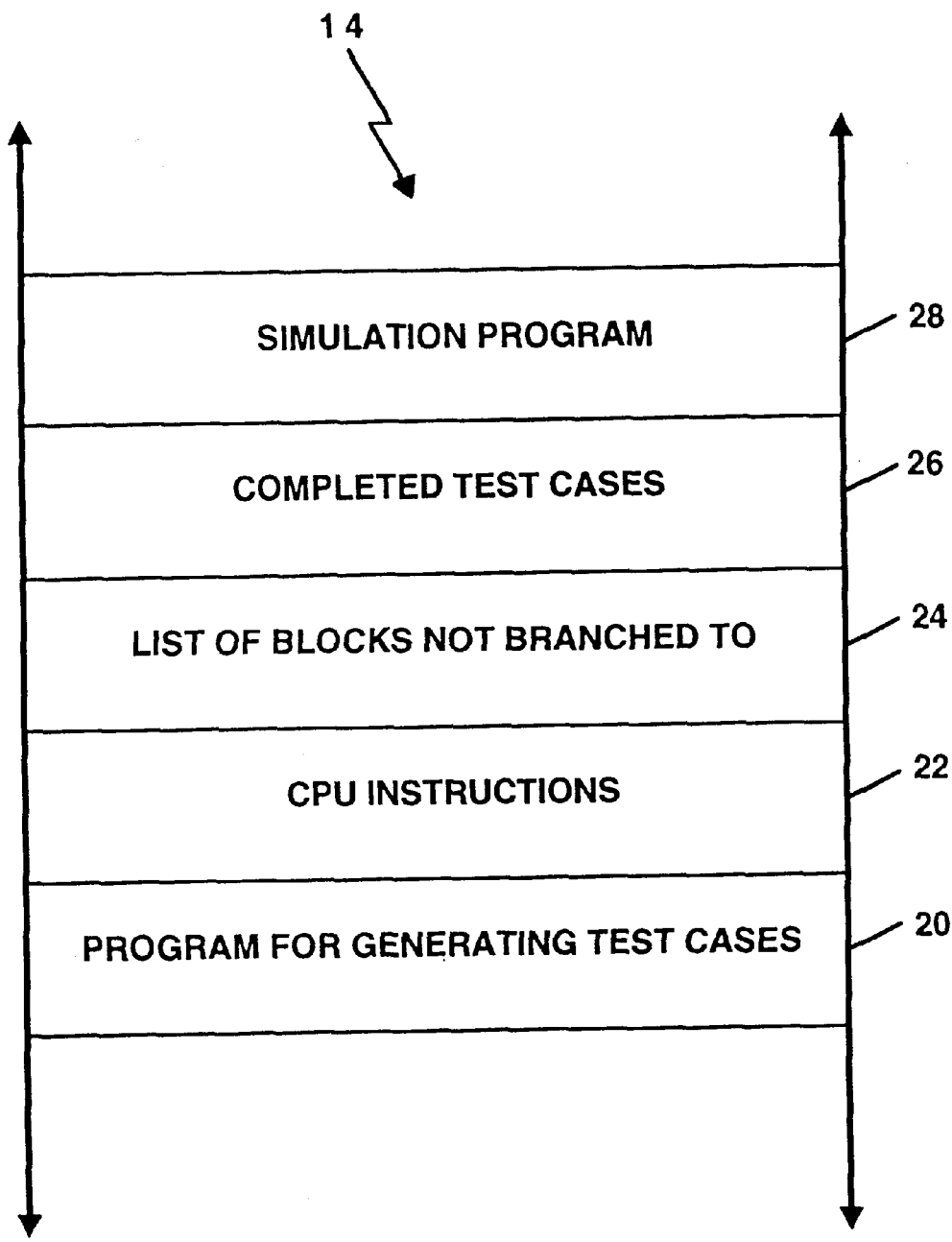
FIG. 2 is a more detailed view of a memory system storing data structures which are used in the computer system of FIG. 1.

FIG. 2 shows the memory system 14 apportioned into several different sections including a section storing the test case generating program 20, a section storing central processing unit instructions 22 which comprise blocks of the test case to be executed on the computer system 10, a list of blocks 24 which are not the destination of any branching instruction, space for the completed test cases 26, and a simulation program 28 for executing the test cases. When program 20 is executed it produces a test case, without generating infinite loops. The test case is fed to a simulation program 28 running on the same or another system to verify the design of an integrated circuit or a model of a CPU. The central processing unit 12 of computer system 10 will fetch each instruction from the program 20 stored in memory 14, retrieve CPU instructions from memory portion 22, build instruction blocks from those instructions, and place the blocks in the output or test case portion of memory 26. The result of the generation of the instruction blocks is a complex branching test structure which can be supplied to a simulation system without forming infinite loops.

A pseudo random number generator is used to randomly select the number of instruction blocks and the number of instructions which comprise each block. These pseudo random numbers (hereafter referred to as random numbers) are generated using equations which operate on a seed value. The seed value is stored in the memory system and is initially set to the system time when the program is executed. The pseudo random number generating method is comprised of the following elements:

Constants: $A = 48271$ $M = 2147483647$ $Q = M/A$ $R = M \% A$ (where % is modulo)

Variables: seed = initially this is the current time max = highest maximum number to be generated Equation: temp_num = $((\text{seed} \% Q) * A) - ((\text{seed}/Q) * R)$ if (temp_num > 0) seed = temp_num else seed = temp_num + $M$ temp2_num = seed $* (1/M)$ random_number = temp2_num $*$ (max + 1)

The equation is implemented as part of the test case generating program on the same computer system as depicted in FIG. 1. Because it is accessed many times during the operation of the program, a new value for the seed is stored each time a random number is generated. This ensures that the same seed value will not be used more than once in a test case generating cycle, except upon a random occurrence.

Figure 3:
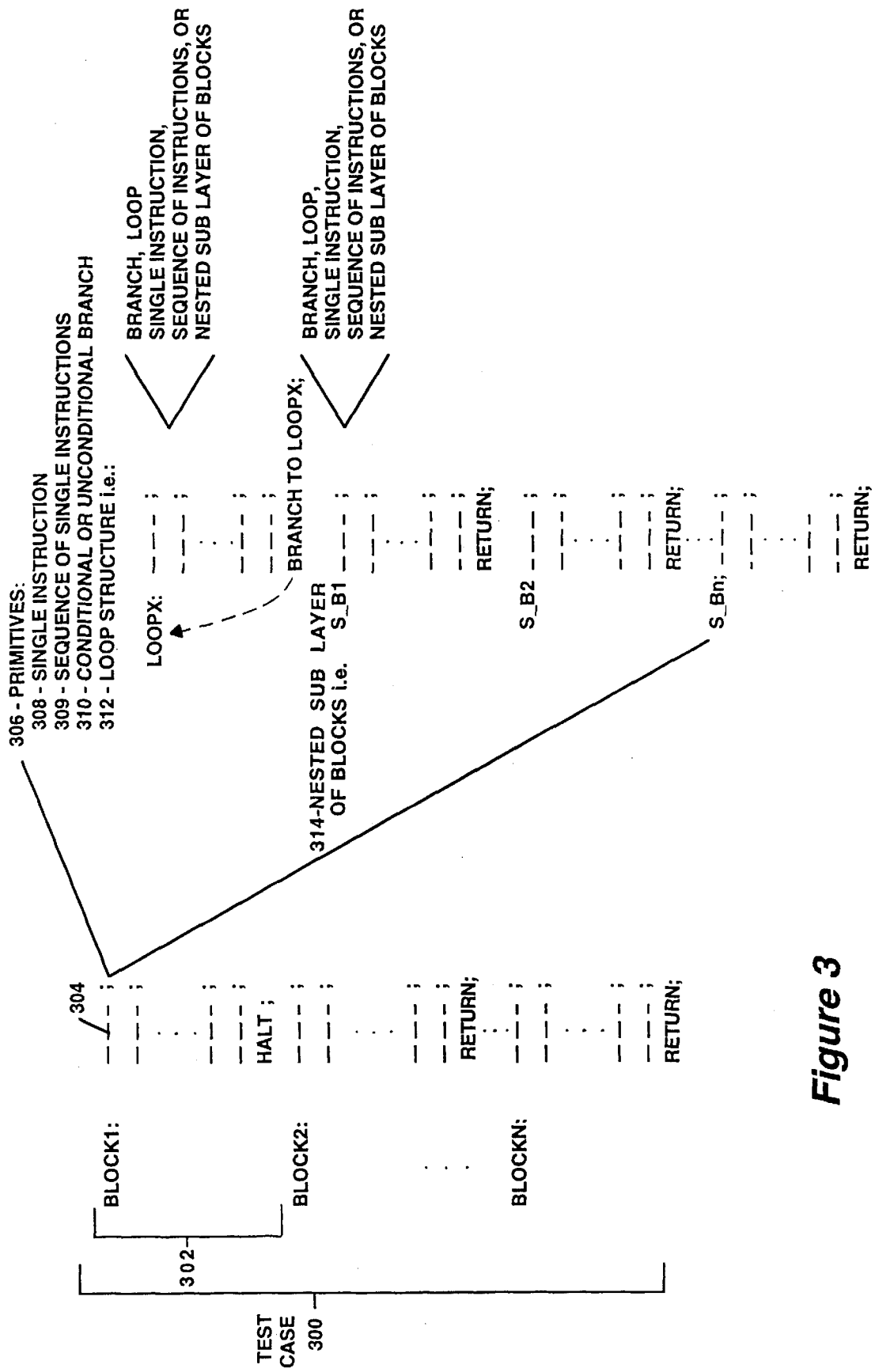
FIG. 3 is a depiction of the general structure of a test case produced by the test case generating program executed on the computer of FIG. 1.

As depicted in FIG. 3, the structure of a test case 300 is comprised of a random number of blocks 302 each comprised of a random number of slots 304. Each slot 304 is filled with an instruction or group of instructions called primitives 306. A primitive is comprised of either single instructions 308, a sequence of single instructions 309, control flow instructions (e.g., conditional or unconditional branches) 310, controlled loops of groups of primitives 312, or a nested sub-layer of blocks 314 each comprised of random numbers of primitives. This nested layering of blocks 314 allows very complex branching tests to be constructed because a jump to the beginning of a block may cause a series of jumps to sub-levels within that block. There can be as many sub-levels as specified by the engineer. This gives better test coverage by constructing combinations of tests which would be too complicated to design by hand.

Some of the elements which comprise a primitive are the branching instructions 310 which allow jumps in forward and reverse directions to other blocks. Here the jumps are produced in such a manner so as to avoid infinite loops. This is accomplished by allowing only one branch or jump to a particular block 302 in a single test case 300. A list of blocks which have not been branched to is stored by the system. Before placing a branch instruction 310 within a primitive 306, it selects a destination block from the list. If the list has no more destination blocks, the system will select another, non-branching, instruction to insert into the primitive. This selection process ensures that each block 302 has no more than one branch path to it. The restriction prevents the system from placing a branching primitive 310 in a first block whose operation is to branch to a second block, which already has a branch instruction 310 back to the first block. If allowed to execute, such a structure would cause an infinite loop.

Figure 4:
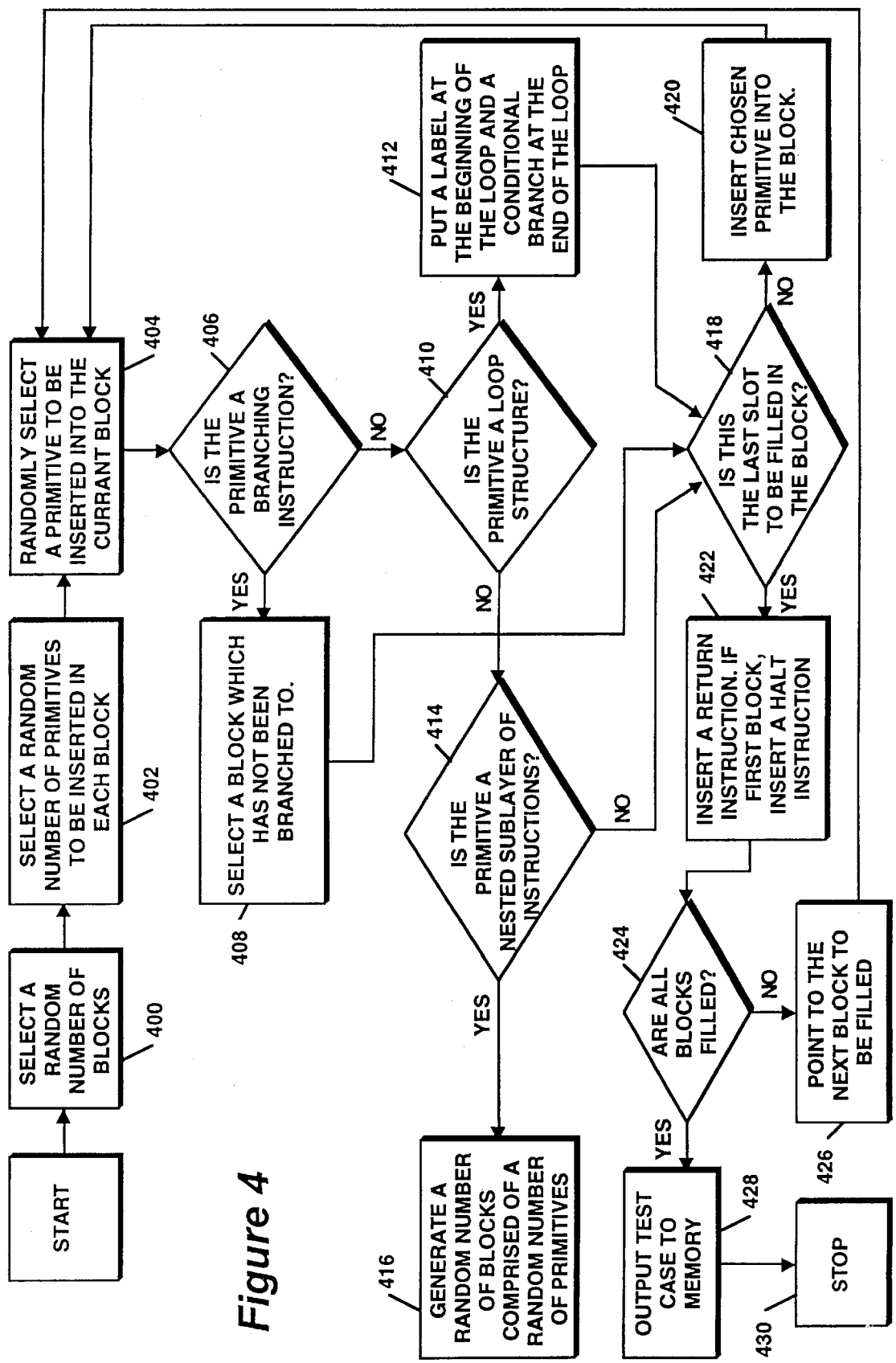
FIG. 4 is a flow chart diagram depicting the steps of randomly generating a simulation test case without causing infinite loops.

Referring now to FIG. 4, a flow diagram is shown depicting the operation of the test case generating method. The system begins by selecting a random number of blocks capable of holding a random number of central processing unit instructions (step 400). The number of blocks is chosen from a user defined range from zero to the value of the max variable specified in the equation, which can be changed based on the requirements of the simulation.

Once a random number of blocks are chosen, the same random number generator is used to select the number of primitives to be inserted into each block (step 402). In this manner each block could include many primitives or none at all. The benefit of a block which does not contain any primitives is that it tests the response of the simulated system to quickly returning subroutines. These subroutines change the rate at which return instructions occur in the system and since they are comprised of unconditional branches, stress the branch prediction algorithms.

Next, a primitive is randomly chosen to be inserted into the block (step 404). As described above, if the primitive is a branching type (step 406), the system randomly selects a block from the list of those which have not been branched to (step 408), and uses it as the branch destination. If the list is empty, another type of primitive is chosen and inserted.

If the primitive chosen is a controlled loop structure (step 410) a unique label is inserted at the location of the first primitive and a conditional branch instruction placed as the last primitive (step 412). When the simulation reaches the bottom of the loop, the specified condition will be evaluated. If the condition warrants another pass through the code, the branch will be taken and execution passed to the point where the label was placed.

Another special case of primitives occurs if the chosen primitive is a nested sub-layer of instruction blocks (step 414). This type of primitive is comprised of a random number of blocks with each block having a random number of primitives composed of either single instructions, a sequence of single instructions, control flow instructions, controlled loops of groups of instruction blocks, or another nested sublayer of blocks (step 416). When this type of primitive is chosen, the same process as depicted in FIG. 4 is followed except that the last instruction in the first sub-layer block is always a branch instruction which skips over the nested sub-layer structure. The reason for this is that the nested sub-layer of instruction blocks is inserted as one primitive into the test case block. Therefore, when execution of the nested sub-layer primitive is complete, it branches over the sub-layer structure to the next primitive in the sequence.

During execution, a determination is made as to whether the current slot is the last to be filled in the block (step 418). If not, the primitive is inserted into the block (step 420). Otherwise the last primitive to be inserted in each block is a Return instruction comprised of an unconditional control flow instruction (step 422). These instructions have the purpose of returning the simulation's execution from the current block back to the instruction immediately following the branch instruction which jumped there. The only exception to this occurs in the first block of the test case. This block always ends with an instruction which terminates execution of the code, typically a Halt instruction.

After each block is filled, the system checks to see if all blocks are completely full (step 424). If not, the process begins again for the next empty block (step 426). Otherwise the completed test case is output to memory (step 428) and execution stops (step 430).

A pseudo source code listing which depicts an example of a test case is set out below:

```
Block_1:   Primitive_1;
           .
           .
           .
           Primitive_n;
           R2 = 0;
           R1 = address of Block_5;
           JMP (R1);
           BEQ R2,Block_6
           Primitive;
           Halt;
Block_2:   Primitive_1;
           Primitive_n;
loop1:     R22 = 0;
           ADDL R22, (R23),R24;
           BEQ R24,loop1;
           Return;
Block_3:   R31 = 0;
           BNE R31,Block_2
           Primitive_1;
           .
           .
           .
           Primitive_n;
           Return;
Block_4:   Primitive_1;
           .
           .
           .
           Primitive_n;
           BSR R31,Block_7;
           Return;
Block_5:   Primitive;
           BSR R31,Block 3;
           Primitive_1;
           .
           .
           .
           Primitive_n;
           Return;
Block_6:   Primitive;
           Return;
Block_7:   Return;
```

Execution of this test case begins in Block 1 where several primitives are executed before register R1 is loaded with the address of Block 5. The jump instruction is unconditional so no evaluation is necessary to pass execution to Block 5. Block 5 executes several unspecified primitives, and a branch to subroutine instruction which jumps to Block 3. Block 3 first loads register R31 with zero. The next primitive is a conditional branch which is only executed if R31 is non-zero. Since the condition fails, no branch is taken to Block 2. Several other primitives are executed and then the return instruction passes control from Block 3 back to Block 5.

Within Block 5 several primitives are executed, then the return instruction unconditionally jumps back to Block 1. Since the return instruction passes control back to the instruction immediately following the one which branched to the current block the BEQ, or branch if equal, instruction evaluates R2. Since R2 does equal zero, the branch is executed to Block 6. A single primitive is executed before the return instruction passes control back to Block 1. One last primitive is executed then the halt instruction terminates the case. Of specific note is that not all blocks were, nor have to be, executed. For example, Block 2 was never entered due to the failed branch condition in Block 3. This produces a test case very similar to the way a computer program actually executes. Because only one branch is allowed to point to each block, no infinite loops were generated.

Having described a preferred embodiment of the invention, it will now become apparent to one of ordinary skill in the art that other embodiments incorporating its concepts may be used. It is felt, therefore, that this embodiment should not be limited to the disclosed embodiment, but rather should be limited only by the spirit and scope of the appended claims.

What is claimed is:

1. A method for generating a test case for testing integrated circuits which comprises the step of:

apportioning a plurality of instructions, in a random manner, into a plurality of groups of test instructions with at least some of said plurality of groups including a plurality of control flow instructions wherein a first of said plurality of groups is branched to from only one of said plurality of control flow instructions thereby preventing said testing of integrated circuits from generating an infinite loop, said apportioning occurring before said plurality of groups of test instructions are executed.

2. The method of claim 1 which further comprises:

storing a list of groups of which said control flow instructions have not transferred execution to, for the purpose of insuring said control flow instructions each transfer execution to a different one of said plurality of groups by checking said list of groups before apportioning said plurality of instructions.

3. The method of claim 2 wherein some of said test instructions are constructed by apportioning said plurality of instructions into a nested sublayer including a plurality of groups with at least some of said plurality of groups including a plurality of control flow instructions and with each control flow instruction in said groups having said control flow instructions transfer execution to a different one of said plurality of groups.

4. The method of claim 3 wherein some of said test instructions are comprised of groups of pseudo random numbers of said plurality of instructions having a conditional branch as the last instruction in the sequence which causes said sequence to continually execute until a specified condition occurs.

5. The method of claim 4 wherein said plurality of instructions are comprised of simulation inputs for a simulation model of an integrated circuit.

6. The method of claim 4 wherein said plurality of instructions are comprised of simulation inputs for a simulation model of a central processor unit.

7. The method of claim 4 wherein said plurality of instructions are comprised of representations of electrical signals which can be mapped into corresponding electrical signals for testing an integrated circuit.

8. The method of claim 4 wherein said plurality of instructions are comprised of representations of electrical signals which can be mapped into corresponding electrical signals for testing a central processor unit.

* * * * *